Jan. 26, 1965 L. M. VALLESE 3,167,724

HOOK TYPE TRANSISTOR RELAXATION OSCILLATOR

Filed Dec. 28, 1960 2 Sheets-Sheet 1

INVENTOR.
LUCIO M. VALLESE
BY Philip Schneider
ATTORNEY

HOOK TYPE TRANSISTOR RELAXATION OSCILLATOR

Filed Dec. 28, 1960 2 Sheets-Sheet 2

INVENTOR.
LUCIO M. VALLESE
BY Philip Schneider
ATTORNEY

United States Patent Office 3,167,724

Patented Jan. 26, 1965

3,167,724
HOOK TYPE TRANSISTOR RELAXATION OSCILLATOR

Lucio M. Vallese, Glen Ridge, N.J., assignor, by mesne assignments, to the United States of America as represented by the Secretary of the Navy Filed Dec. 28, 1960, Ser. No. 79,091
2 Claims. (Cl. 331—111)

This invention relates to transistor circuits and especially to transistor relaxation oscillator circuits.

One of the disadvantages of many oscillator circuits is the change in frequency which occurs when the oscillator is loaded down by an output circuit. For this reason it is often necessary to interpose a buffer amplifier between oscillator and load. The present invention tends to avoid such a need by permitting a physical separation of the oscillation inducing elements and the load, thus limiting interaction between them. In fact, the oscillation inducing elements may be placed either in the input circuit or the output circuit, so that any point from which it is desired to derive an output signal can be separated from the oscillation-inducing elements.

The advantages of the present invention are accomplished by utilizing a hook common-emitter transistor circuit in which the oscillation-inducing elements can include: (*a*) inductance, to maintain the input current constant when the voltage at the input of the transistor circuit has values which bring it into the negative resistance region of the input voltage-input current characteristic curve; or/and (*b*) capacitance, to maintain the output voltage constant when the values of the output voltage bring it into the negative resistance region of the output voltage-output current characteristic curve. In case (*a*), the value of the resistance in the input circuit must be less than the magnitude of the negative resistance, and in case (*b*), the value of the resistance in the output circuit must be greater than the magnitude of the negative resistance, as will hereinafter be shown.

An object of this invention is to provide a flexible transistor relaxation oscillator.

Another object is to provide a transistor relaxation oscillator in which the oscillation-inducing elements can be isolated from the load.

A further object is to provide a transistor relaxation oscillator having a repetition rate which is controllable either internally or externally.

Yet another object is to provide a transistor relaxation oscillator which can be used as noise, or complex frequency spectrum, generator.

Other objects and many of the attendant advantages of this invention will be readily appreciated as the same becomes better understood by reference to the following detailed description when considered in connection with the accompanying drawings wherein.

Figure 1:
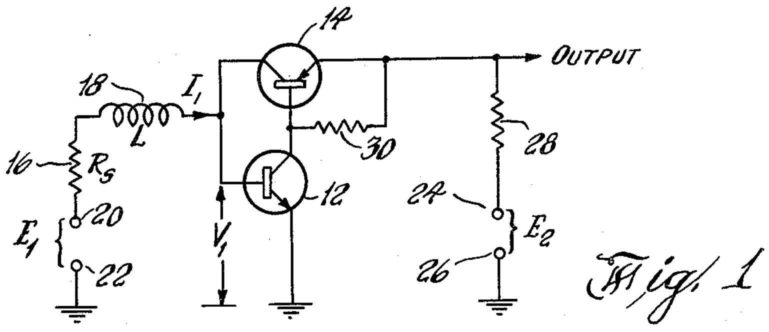
FIG. 1 is a schematic circuit diagram illustrating one embodiment of the invention.

In the embodiment shown in FIG. 1, a pair of transistors 12 and 14 are connected in a circuit configuration which shall be designated herein as a "hook common-emitter circuit." The emitter of transistor 12 is grounded and the resultant input signal ($V_1$) is applied to its base. The collector of transistor 12 is connected to the base of transistor 14 and the collector of transistor 14 is coupled back to the base of transistor 12. The former transistor thus provides prositive feedback for transistor 12.

Forward bias for the base-emitter circuit of transistor 12 is provided through a resistance 16 ($R_s$) and an inductance 18 (L) from a source of constant potential, $E_1$, only the connections to which are shown. The input current, $I_1$, to the base of transistor 12 is indicated by an arrow.

A source of constant supply voltage, $E_2$, only the connections (24, 26) to which are shown, is connected to the emitter of transistor 14 through a load impedance 28, ($R_2$), which may be a resistance. A further resistance 30, connected from the emitter of transistor 14 to the collector of transistor 12, applies the correct value of supply voltage to the latter. An output signal may be taken from the low potential end of the load impedance 28 to ground. These points may also be employed for collector triggering.

The transistor types shown may be interchanged with their complementary types provided that correct polarities for the supply voltages are maintained.

Figure 2:
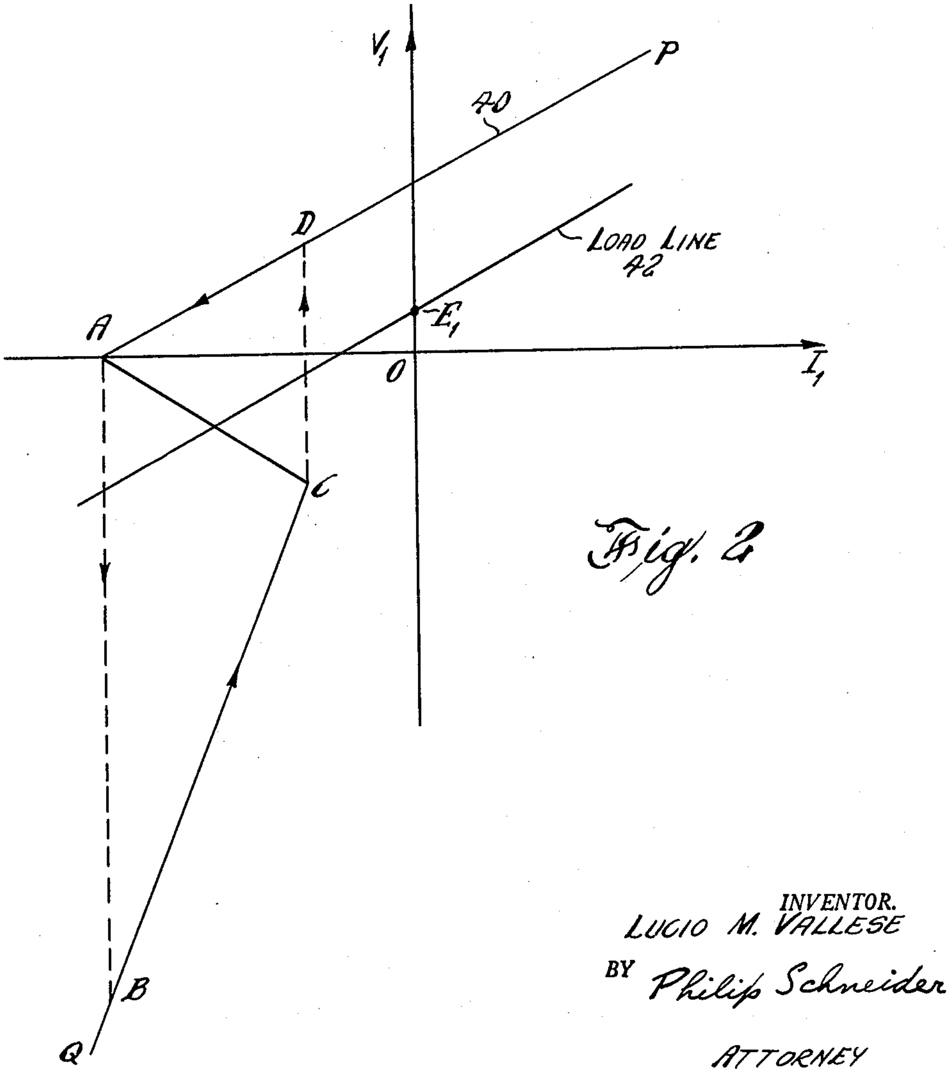
FIG. 2 is a diagram of the input $V_1$—$I_1$ characteristic curve of the hook common-emitter arrangement in which the transistors of FIGS. 1 and 3 are connected, together with a showing of the operating cycle of the embodiment shown in FIG. 1.

FIG. 2 shows the input voltage-input current ($V_1$–$I_1$) charteristic 40 (PACQ) of the hook common-emitter circuit arrangement of the transistors. It is to be noted that the characteristic exhibits a negative resistance region, AC.

To operate this device as a relaxation oscillator, the load line 42 must cut the characteristic curve 40 only once and in the negative resistance region, AC. This means that the total resistance at the input must be smaller in value than the magnitude of the negative resistance. A value of $R_s$ is therefore chosen which together with the other input circuit resistance (e.g., the resistance of the inductance 18 and of the bias source $E_1$ will be less than the magnitude of the negative resistance. The point at which this load line 42 crosses the $V_1$ axis is the proper value for $E_1$.

To understand the operation of the device, assume that for some reason the operating point is on the section of the curve between B and C and the current $I_1$ is increasing (becoming more positive). This means that the characteristic curve 40 is being traversed from B to C in the direction of the arrow. When point C is reached, the current I would start to decrease except for the presence of the inductive storage element 18 which tends to prevent sudden changes in current. The current $I_1$ is thus maintained at a constant value until point D is reached. A rapid rise in input voltage V occurs between points C and D, since $V_1$ is the difference between $E_1$ and the voltage drops across $R_s$ and L, and when the current is prevented from changing, the voltage drop across L disappears. At point D, operation along the characteristic curve is again resumed and the current $I_1$ begins to decrease. This condition continues until point A is reached whereupon the current $I_1$ tries to increase along the negative resistance region, AC. Again, the sudden change in direction of current is prevented by the action of the inductive storage element 18, with the result that a constant current is maintained while the voltage $V_1$ rapidly shifts from point A to point B of the characteristic curve. The cycle ABCD continues to repeat itself. As is apparent, the current, $I_1$, has a sawtooth wave shape and the voltage, $V_1$, has a trapezoidal wave shape. The output current and voltage are sawtooth waves.

Figure 3:
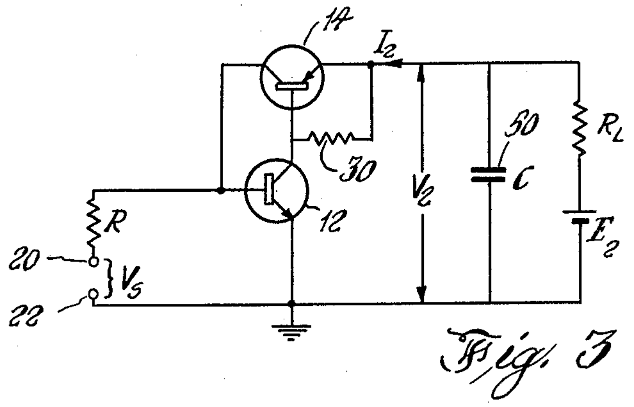
FIG. 3 is a schematic circuit diagram illustrating a second embodiment of the invention.

FIG. 3 illustrtes an embodiment of the invention in which the storage element is a capacitance 50 which is connected from ground to the emitter element of transistor 14. In this embodiment, the inductive storage element at the input circuit is not employed, although both input inductive and output capacitive elements may be employed simultaneously, if desired. The input signal at terminals 20 and 22 is labeled $V_s$ to indicate that it may include other signals as well as the biasing potential $E_1$, for example, a synchronizing signal may be added to $E_1$.

Figure 4:
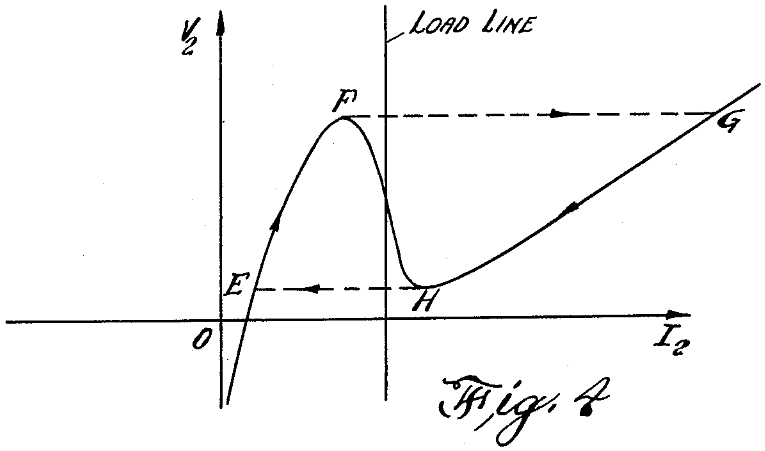
FIG. 4 is a diagram of the output $V_2$–$I_2$ characteristic curve of the hook common-emitter arrangement in which the transistors of FIGS. 1 and 3 are connected, together with a showing of the operating cycle of the embodiment shown in FIG. 3.

The operating cycle, EFGH, for this embodiment is shown in FIG. 4 and is similar to that obtained with the inductive storage element. However, in this case, the capacitive storage element keeps the output voltage, $V_2$, from changing abruptly at point F and H, instead of operating on the current.

If desired, external synchronizing pulses may be applied at various locations, such as the input terminals 20, 22 or the output terminals 24, 26. It is also possible to synchronize internally—that is, if both types of storage elements are employed, one at the output and one at the input side of the circuit, one of the storage elements may be considered as producing the desired oscillations and the other as producing synchronizing oscillations. Where oscillations are produced in both input and output sides of the circuit, the waveshapes tend to be more complex and the device may be used as a noise, or harmonic generator.

It should be noted that the use of the terms "input" and "output" circuit for a transistor device is somewhat misleading in that such devices are generally not unilateral, so that inputs and outputs can be interchanged. The use of these terms herein is intended to be determinative of location rather than function, the term "input" being employed to refer to the base-emitter circuit of transistor 12, and the term "output" being employed to refer to the external circuit extending between the emitters of the two transistors.

Figure 5:
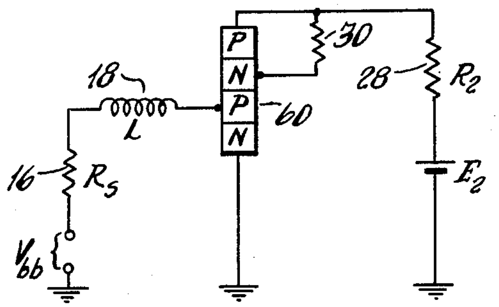
FIG. 5 is a schematic representation of a third embodiment of the invention, which utilizes a four-layer transistor.

A third embodiment of the invention is shown in FIG. 5 where a single four-layer PNPN transistor is employed to replace the two three-layer transistors illustrated in the other embodiments. An analysis of the elements of the four-layer transistor shows that it is inherently equivalent to the two-transistor hook common-emitter circuit shown in FIGS. 1 and 3, and operation of this embodiment is similar to that shown in FIG. 1. The biasing of this transistor makes the top three layers, respectively, the emitter, base and collector elements of a P-N-P transistor like transistor 14 and makes the bottom three layers, respectively, the collector, base and emitter elements of an N-P-N transistor like transistor 12. The second layer from the top thus corresponds to the base of the feedback transistor and the collector of the other transistor, while the third layer from the top corresponds to the collector of the feedback transistor and the base of the other transistor. The feedback is inherent in this four-layer transistor and, with the biasing as shown, the single four-element transistor corresponds to the two-transistor hook common-emitter circuit of FIGS. 1 and 3. Of course, a capacitive storage element at the output may also be employed, either alternatively or additionally.

Obviously many modifications and variations of the present invention are possible in the light of the above teachings. It is therefore to be understood that within the scope of the appended claims the invention may be practiced otherwise than as specifically described.

I claim:

1. A relaxation oscillator comprising, in combination: transistor means corresponding to a pair of transistors, each having a base, emitter and collector element, connected together to form a hook common-emitter circuit, one said transistor providing positive feedback for the other; connections for a source of biasing voltage; an inductive storage element; a first resistance having a value which is less than the magnitude of the negative resistance of the $V_1$–$I_1$ (input voltage versus input current) characteristic of said transistor means, the value of said first resistance including the resistance of said biasing-voltage source and said inductive storage element, said biasing-source connections, said inductive storage element and said first resistance being connected in series between the base and emitter elements of said other transistor; connections for a source of supply voltage; a second resistance, said supply-voltage connections and said second resistance being connected in series between the emitter elements of said transistor; and a third resistance connected between the emitter of said one transistor and the collector of said other transistor for adjusting the supply potential to the proper value for the collector element.

2. A relaxation oscillator comprising, in combination: transistor means corresponding to a pair of transistors, each having a base, emitter and collector element, connected together to form a hook common-emitter circuit, one said transistor providing positive feedback for the other, the emitter element of said other transistor being connected to a point of reference potential which forms one terminal of said transistor circuit; connections for a source of biasing voltage; an inductive storage element; a first resistance having a value which is less than the magnitude of the negative resistance of the $V_1$–$I_1$ (input voltage versus input current) characteristic of said transistor means, the value of said first resistance including the resistance of said biasing-voltage source and said inductive storage element, said biasing-source connections, said inductive storage element and said first resistance being connected in series between the base of said other transistor and said point of reference potential; connections for a source of supply voltage; a second resistance, said supply-voltage connections and said second resistance being connected in series between the emitter element of said one transistor and said point of reference potential; and a third resistance connected between the emitter of said one transistor and the collector of said other transistor for adjusting the supply potential to the proper value for the collector element.

References Cited by the Examiner

UNITED STATES PATENTS

| | | | |
|---|---|---|---|
| 2,655,609 | 10/53 | Shockley | 307—88.5/26 |
| 2,864,062 | 12/58 | Schaffner | 307—88.5/26 |
| 2,890,353 | 6/59 | Overbeek et al. | 307—88.5 |

OTHER REFERENCES

Shockley: Transistor Corporation Application Data, No. AD–3, May 1959.

ROY LAKE, *Primary Examiner.*

HERMAN KARL SAALBACH, JOHN KOMINSKI, *Examiners.*